United States Patent [19]

Lindsay et al.

[11] Patent Number: 4,754,329
[45] Date of Patent: Jun. 28, 1988

[54] FOCUSING AND SCREEN CALIBRATION METHOD FOR DISPLAY SCREEN COUPLED TO VIDEO CAMERA

[75] Inventors: James W. Lindsay, Vancouver; Geoffrey B. Rhoads, Yacolt, both of Wash.

[73] Assignee: Tektronix, Inc., Beaverton, Oreg.

[21] Appl. No.: 37,500

[22] Filed: Apr. 13, 1987

[51] Int. Cl.[4] .......................... H04N 7/18; H04N 17/04
[52] U.S. Cl. ................................ 358/139; 324/121 R; 324/404; 358/101; 358/107; 358/903; 364/551
[58] Field of Search ................ 358/139, 101, 107, 93, 358/903; 324/121 R, 404; 364/551

[56] References Cited

U.S. PATENT DOCUMENTS

| | | | |
|---|---|---|---|
| 4,330,779 | 5/1982 | Wilensky | 358/101 |
| 4,400,731 | 8/1983 | Brown | 358/107 |
| 4,418,388 | 11/1983 | Allgor | 364/551 |
| 4,439,735 | 3/1984 | Alvite | 324/404 |
| 4,467,323 | 8/1984 | Kling | 364/551 |
| 4,677,340 | 6/1987 | Miller | 324/404 |
| 4,695,833 | 9/1987 | Ogura | 324/121 R |

Primary Examiner—Howard W. Britton
Attorney, Agent, or Firm—William O. Geny

[57] ABSTRACT

A method of focusing and calibrating a display screen which is coupled to a video camera where the display screen is not visible when performing the calibration. The method includes the steps of generating a reference signal to display an image on the display screen, capturing an image of the display signal in the video camera and converting the image into digital signals representing the brightness of pixels in a pixel matrix, analyzing the digital signals for data representing predetermined physical parameters of the visual display on the screen, and generating on a separate display screen a graphic representation of these physical parameters. By observing the bar graphs on a microcomputer at the same time that adjustments are made to the focus, intensity, and rotation controls on the oscilloscope, the display screen may be focused and calibrated.

12 Claims, 6 Drawing Sheets

FOCUSING AND SCREEN CALIBRATION METHOD FOR DISPLAY SCREEN COUPLED TO VIDEO CAMERA

BACKGROUND OF THE INVENTION

The present invention relates to a method for focusing and calibrating a display screen which is coupled to a video camera where the display screen is not visible to the eye during the focusing and calibration process.

Digital video cameras have been developed which may be coupled to the display screen of an electronic instrument such as an oscilloscope for taking pictures of and recording visual events. In such applications the camera is coupled directly to the display screen and, hence, the display screen is not visible to the user's eye. What is necessary, therefore, is a method for focusing and calibrating the image trace of the display screen.

SUMMARY OF THE INVENTION

The present invention provides a method of focusing and calibrating a display screen which is coupled to a video camera where the display screen is not visible when performing the calibration. The method includes the steps of generating a reference signal to display an image on the display screen, capturing an image of the display signal in the video camera and converting the image into digital signals representing the brightness of pixels in a pixel matrix, analyzing the digital signals for data representing predetermined physical parameters of the visual display on the screen, and generating on a separate display screen a graphic representation of these physical parameters.

The implementation of this method requires a computer such as a microcomputer having its own display screen. The microcomputer displays a set of analog meters which may be in the form of bar graphs representing certain parameters of the screen signal captured by the video camera as a function of a set of idealized parameter values which are stored in memory in the microcomputer. By observing the bar graphs on the microcomputer at the same time that adjustments are made to the focus, intensity, and rotation controls on the oscilloscope, the display screen may be focused and calibrated.

It is a principal object of this invention to provide a method of calibrating and focusing an image on a display screen where the screen is coupled to a video camera and is therefore not visible to the user.

A further object of this invention is to provide a graphic representation of predetermined parameters of the display screen on a separate display so that the screen may be adjusted by referencing the graph which shows changes in the display screen parameters in real time.

A still further object of this invention is to provide a method and apparatus for calibrating an oscilloscope in a more precise and efficient manner than has heretofore been possible.

The foregoing and other objectives, features, and advantages of the invention will be more readily understood upon consideration of the following detailed description of the invention, taken in conjunction with the accompanying drawings.

DETAILED DESCRIPTION OF THE INVENTION

Figure 1:
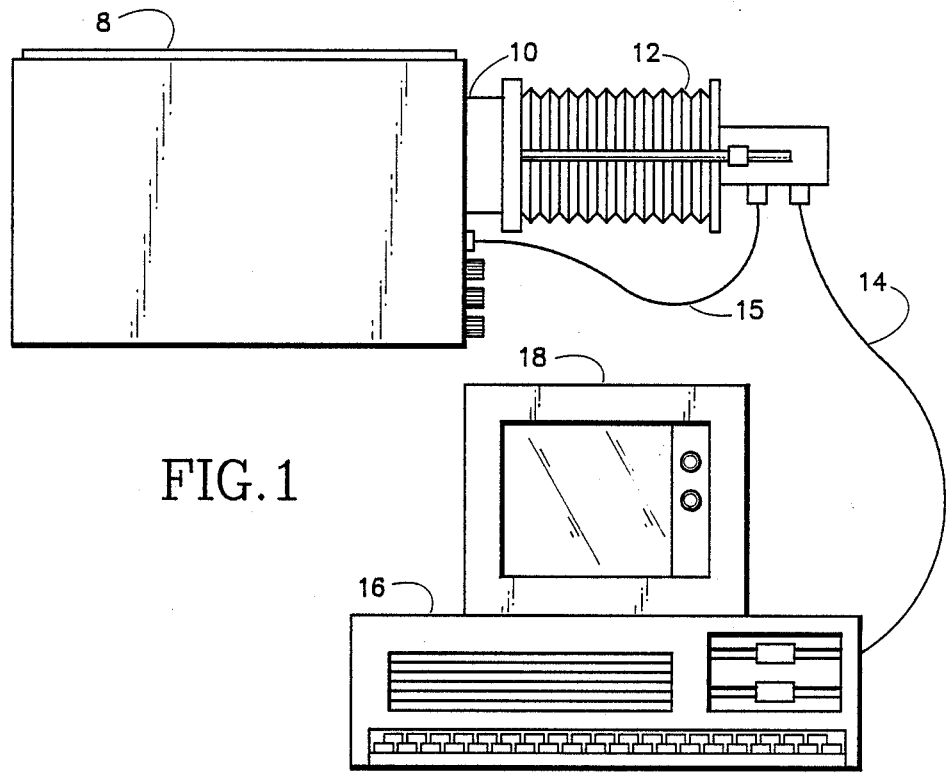
FIG. 1 is a side and front view of the hardware configuration of the present invention.

An oscilloscope 8 includes a display screen 10 which is coupled to a digital camera 12. The digital camera 12 is clamped to the oscilloscope 8 so as to obscure the face of the display screen 10. The digital camera 12 is linked to a microcomputer 16 via cable 14. Cable 15 provides a link from the computer 16 via cable 14 and camera 12 to the vertical amplifier input of oscilloscope 8. The microcomputer 16 includes a display screen 18 which may be a CRT or any other type of conventional screen.

The digital camera 12 is of the type which includes a charged coupled device (CCD). A CCD includes a matrix of sensors which develop output signals as a function of the intensity of light impinging thereon. These signals may be digitized in an analog-to-digital converter (not shown) inside the camera 12. Thus, the output over line 14 to the microcomputer 16 may be a series of signals representing the light intensities of individual pixels in a CCD pixel matrix which, in turn, represents the image appearing on display screen 10.

The CCD in the video camera 12 provides an array of data for each video frame. The array is 512 by 512 bytes for a total array size of 262,144 bytes of information. Each byte of information represents the brightness of a particular pixel. Each pixel element provides a byte containing eight bits of information or 256 different levels of gray scale. Thus, each pixel may assume one of 256 possible degrees of intensity.

Figure 2:
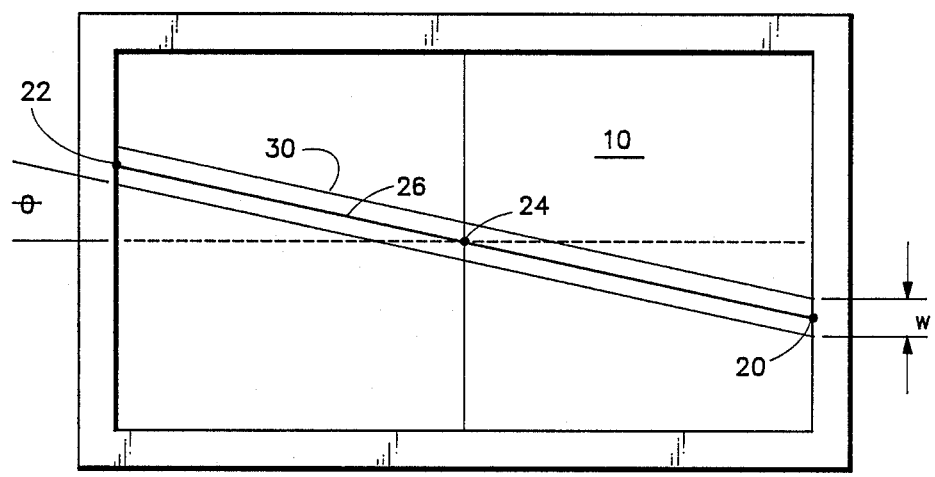
FIG. 2 is a front view of the trace of a reference signal shown on the screen of an oscilloscope or other electronic test instrument.

Referring now to FIG. 2 the screen 10 of oscilloscope 8 shows a straight line trace which is generated by causing the oscilloscope to generate a zero volt DC reference line. This line theoretically extends horizontally across the screen 10 at its center. The nominal center of the screen 10 is determined by reference to markings etched into the glass covering its face. The reference line shown in FIG. 2, however, is skewed to illustrate the operation of the method of the invention. Ordinarily the user calibrates the DC reference line on the screen 10 by adjusting certain controls on the face of the panel of oscilloscope 8. These controls may include "trace rotation," "focus" and "intensity." With a digital camera 12 connected to the front of the oscilloscope 8 and completely obscuring the screen 10, this visual calibration is not possible.

Figure 7:
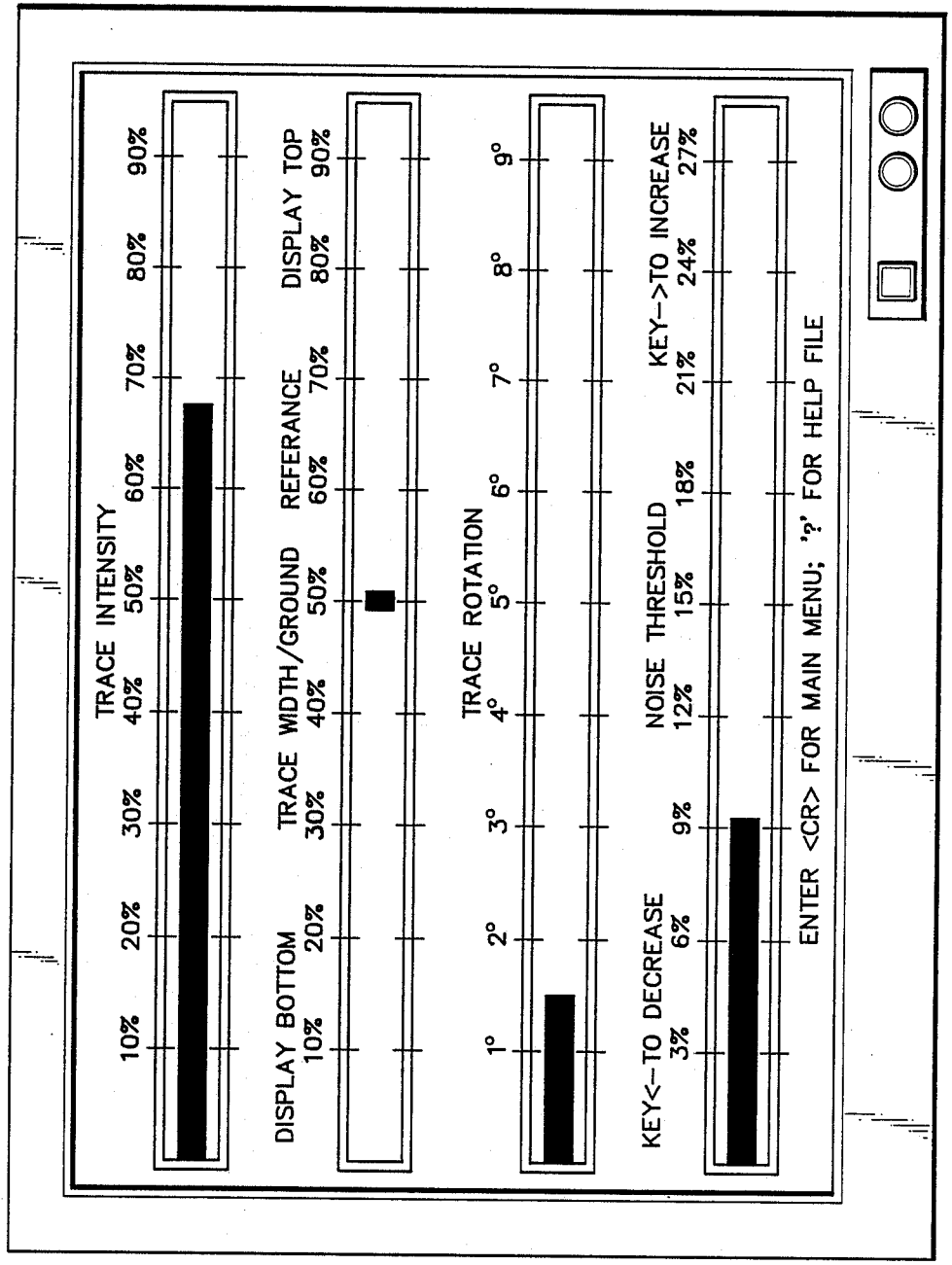
FIG. 7 is a front view of the screen of the microcomputer of FIG. 1 when using the method of the invention.

According to the invention, the camera 12 photographs the trace, digitizes it, and provides it to microcomputer 16. The microcomputer 16 has stored within its memory, reference information representing an ideal DC zero volt horizontal trace. The signals representing the actual trace shown on the face of the screen 10 are compared with the idealized values stored in memory, and a graph is generated, an example of which may be found in FIG. 7 showing the relative differences between the actual screen trace and the data representing the reference trace. The actual trace on screen 10 as shown in FIG. 2 has a width indicated by dimension W shown between the arrows on the right side of the trace in FIG. 2 and includes a center pixel point 20 which will appear at the right-handmost column of the screen and represents the brightest (i.e. highest grey scale value) pixel in the column. Similarly, a left-handmost center pixel point 22 will appear on the left-hand column of the screen. The center of the trace is indicated by pixel point 24 which is the brightest pixel in the center column of the matrix. These three pixels 20, 22 and 24 define the center line 26 of the trace 30. The center line 26 comprises a continuous straight line of pixels beginning at point 22 and proceeding through point 24 to point 20. Pixels above and below the centerline 26 which are included in the trace 30 are not as bright as the pixels in centerline 26. The dashed horizontal line in FIG. 2 is the horizontal axis, and the angle $\theta$ made by centerline 26 with respect to the horizontal axis is referred to as the "trace rotation."

FIG. 7 shows a bar graph generated on the screen 18 of microcomputer 16. The first line of the bar graph labeled "trace intensity" is the brightness of the trace as a function of a brightness level stored as a reference signal in memory which represents the maximum brightness achievable on the screen 10. The trace intensity is generated as a percentage by comparing the actual sensed intensity with the reference signal. The second line of FIG. 7 represents the trace width as a percentage of ground reference. This means that the width of the sensed trace is compared to the total width of the display. Any row of pixels having an intensity above a noise threshold will be counted to determine the trace width. The third line of the bar graph is the trace rotation and repressents the angle $\theta$ made by the centerline 26 in relation to true horizontal. The final bar labeled "noise threshold" represents the percentage of the overall trace 30 that is spurious light or "noise."

Figure 3:
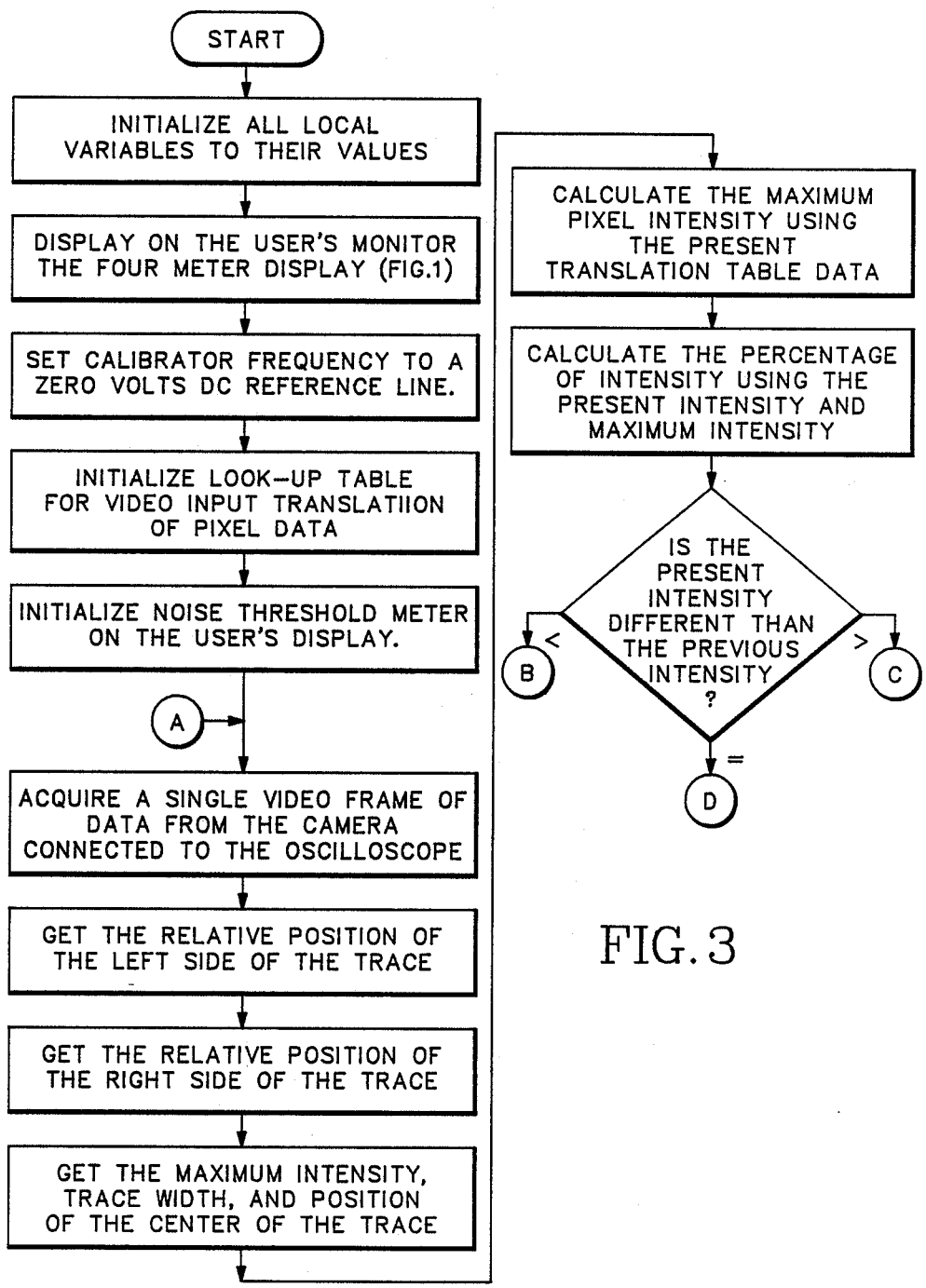
FIG. 3 is a flow chart diagram describing a computer program for the microcomputer of FIG. 1 to be used in performing the calibration method described by the invention.
Figure 4:
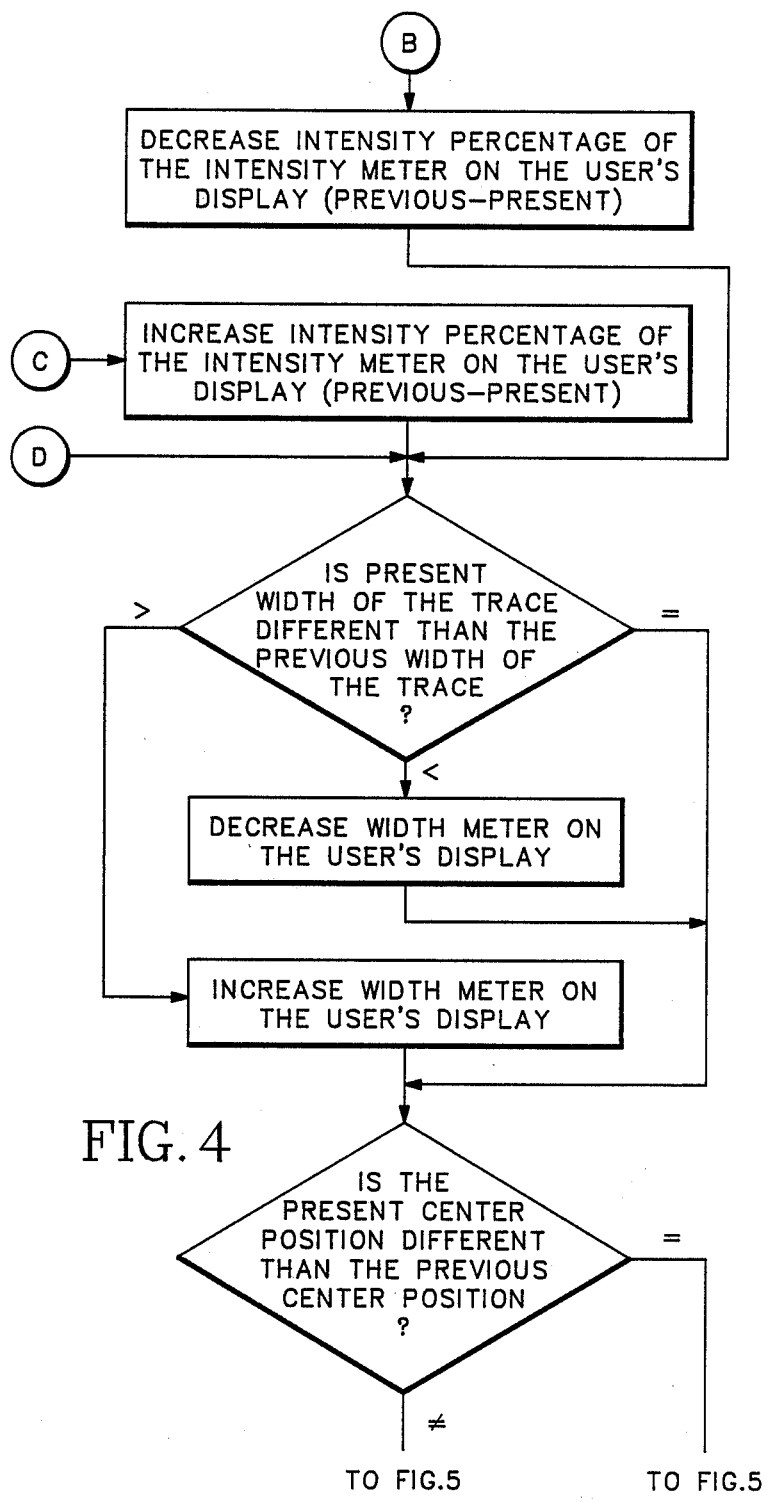
FIG. 4 is a continuation of the flow chart diagram of FIG. 3.
Figure 5:
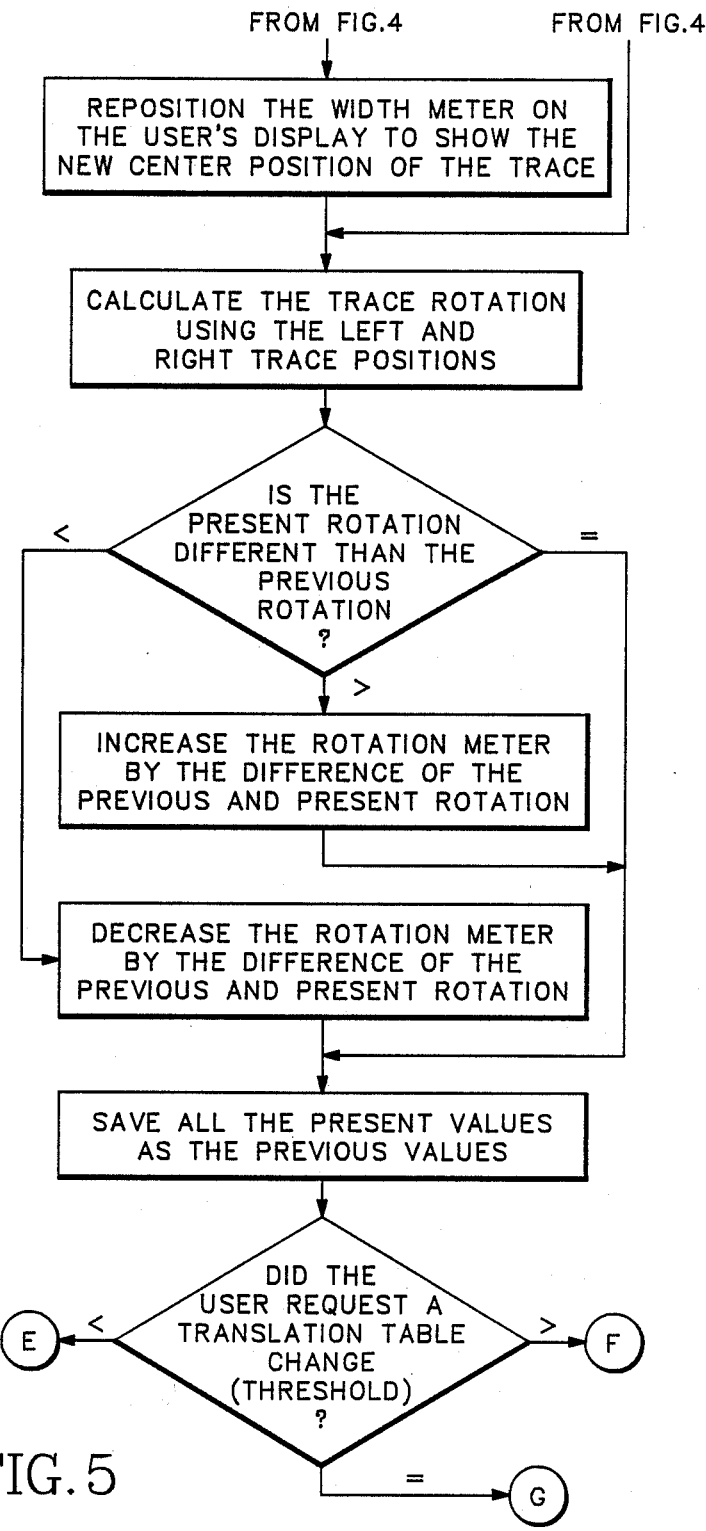
FIG. 5 is a continuation of the flow chart diagram of FIG. 4.
Figure 6:
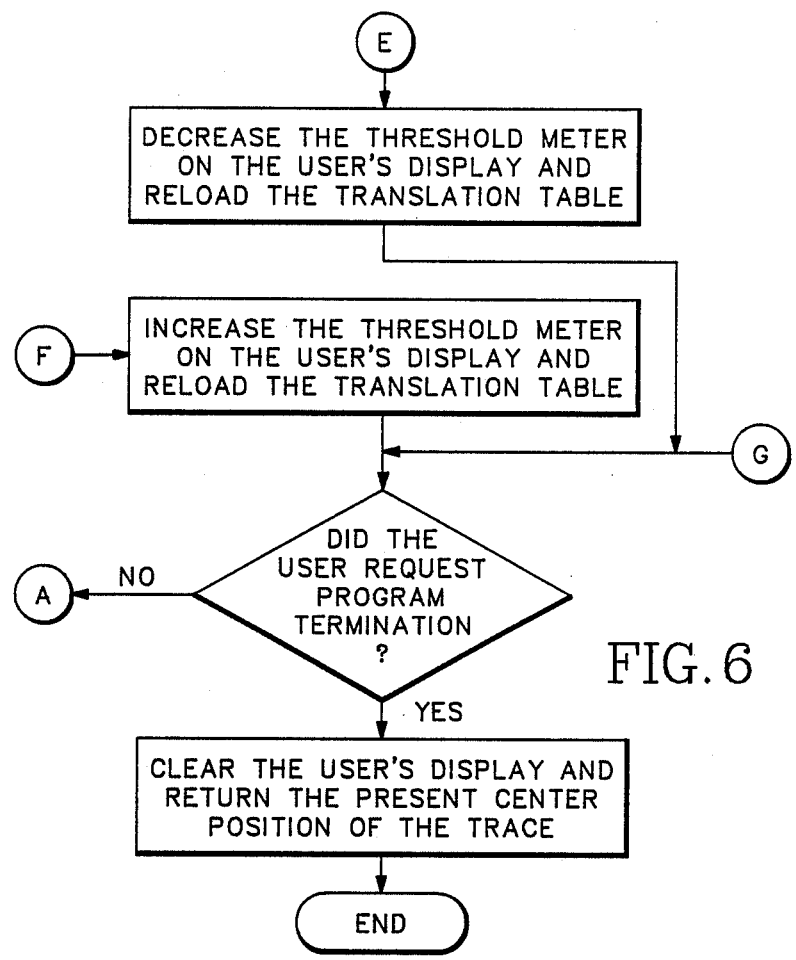
FIG. 6 is a continuation of the flow chart diagram of FIG. 5.

Referring now to FIGS. 3, 4, 5 and 6 a flow chart diagram illustrates the way in which the microcomputer 16 is programmed to continuously generate, in real time, the analog meters or bar graphs shown in FIG. 7. The digital camera 12 is a video camera and as such provides 30 frames of data per second which are analyzed and displayed in the bar graph form shown in FIG. 7. Referring to FIG. 3 the computer 16 first initializes local variables and displays on the monitor the analog meter display of FIG. 7. Next, an internal signal is generated to set the display of the oscilloscope 8 to a zero volt DC reference line. This signal is provided to the oscilloscope 8 over line 15 which is connected to its vertical amplifier input. Next, a look-up table containing reference data for the various screen parameters, which is stored in memory in computer 16, is initialized for input translation of pixel data from video camera 12. The noise threshold meter on the display of FIG. 7 is also initialized so that the first N values of noise information will be treated as essentially zero noise and further noise data will cause the meter to increase incrementally after that.

After initializing the screen and setting the DC zero volt reference line signal for the oscilloscope, the computer 16 is ready to begin acquiring data. As the camera 12 scans the oscilloscope screen 10 it acquires data one frame at a time. For each frame so acquired the computer performs the following steps of FIGS. 3, 4, 5 and 6. First, the computer obtains the relative positions of the left and right sides of the trace as represented by pixel points 22 and 20 in FIG. 2. This is done by finding the pixels in the right and left extreme columns that have the highest grey scale values, respectively. Next, the computer obtains the trace width ("W" in FIG. 2) and the position of the center of the trace (pixel 24 of FIG. 2). The intensity of the trace is found by adding the grey scale values of all pixels in each column whose brightness exceeds a grey scale threshold (i.e. is not noise). The center pixel 24 is found by examining each pixel in the center column of the matrix, and locating the one with the highest grey scale value. Next, the maximum trace intensity of a zero volt DC trace is determined using reference data stored in a translation table in memory in computer 16. The percentage of this intensity represented by the intensity of the video trace captured in the present data frame is then calculated. Next the computer determines whether the present intensity is different from the previous frame's intensity and decreases or increases the meter reading of the "trace intensity" bar graph of FIG. 7, accordingly.

As the flow chart shows, this process is repeated for the other values to be monitored including trace width, trace rotation and noise threshold. The trace width is calculated by finding pixels in a representative column having a minimum predetermined intensity and counting the number of rows lying between these pixels. This step may be repeated for all columns if desired to provide greater accuracy. The trace width is then displayed as a percentage of the total screen width beginning at midscreen (i.e. above and below a theoretical center line). The trace rotation is determined by finding the pixel having the highest grey scale in each end column and calculating the angle made by a line between these two pixels and the reference DC center line representing zero volts. Whenever any calculated value differs from that calculated in the previous frame, the meter display of FIG. 7 is adjusted.

As the values are being displayed in the analog meters of FIG. 7, the user may adjust the oscilloscope by using conventional front panel controls that regulate "brightness," "focus" and "rotation." Thus, the scope 8 can be adjusted for maximum trace intensity with minimum trace width and minimum trace rotation while at the same time decreasing the noise threshold. Thus, the oscilloscope screen 10 is made to duplicate the position of the ideal trace generated by the computer 16 to the extent desired by the user. In this way the oscilloscope 8 may be calibrated for the particular job at hand even though the screen 10 is not visible to the user during this time. The display in real time of the above-described parameters of the trace on the screen 10 by the computer 16 enables the user to adjust the oscilloscope 8 so that video representations of test data will reflect a calibrated standard that will also have the requisite brightness and sharpness of image.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A method of calibrating a display screen having adjustment controls coupled to a video camera such that the display screen is not visible when performing said method, comprising the steps of:
   (a) generating a reference signal on the display screen;
   (b) capturing an image of the display screen in said video camera and converting said image to digital signals representing the brightness of pixels in a pixel matrix;
   (c) analyzing said digital signals for data representing predetermined physical parameters of the visual display; and
   (d) displaying a graphic representation of said physical parameters on a separate display screen visible to a user, whereby said display screen may be calibrated by manipulating said adjustment controls while observing said graphic representation on said separate display.

2. The method of claim 1 wherein said reference signal is a straight horizontal line image representing a DC zero volt signal.

3. The method of claim 1 wherein said graphic representation is in the form of a bar graph.

4. The method of claim 1 wherein one of said physical parameters is the relative intensity of said image.

5. The method of claim 1 wherein one of said parameters is the trace width of said image.

6. The method of claim 1 wherein one of said physical parameters is the trace rotation of said image.

7. The method of claim 6 wherein step (b) further includes the step of scanning two separate columns of the pixel matrix and determining the identity of the pixel in each respective column having highest gray scale value.

8. The method of claim 4, further including the steps of scanning each column and determining all pixels having a grey scale value above a preset threshold, summing the grey scale intensities of said pixels, and dividing said sum by a maximum gray scale reference value.

9. The method of claim 8 wherein step (c) includes displaying said trace intensity as a percentage of a reference maximum trace intensity for the display screen.

10. The method of claim 5 wherein step (b) further includes determining the width of the image by determining the row designations of pixels having predetermined minimum gray scale values, calculating the number of rows separating said row designation, and dividing this number by the total number of rows in the pixel matrix.

11. The method of claim 10 wherein the graphic representation of step (c) comprises a bar graph wherein the width of the bar to either side of a center point expresses the trace width as a percentage of the total width of the display screen.

12. The method of claim 7, further including the step of determining the trace rotation by finding the respective row positions of the brightest pixels in said two separate columns, respectively, and calculating the number of degrees in an angle defined by the intersection of a line extending between said brightest pixels and a theoretical true horizontal centerline.

* * * * *